(12) United States Patent
Ratner

(10) Patent No.: US 8,178,810 B2
(45) Date of Patent: May 15, 2012

(54) ELECTRIC-SWITCH ACTIVATED BY SENSING A TOUCH THROUGH A LARGE VARIETY OF COVER-PLATE MATERIALS

(75) Inventor: David L. Ratner, Santa Monica, CA (US)

(73) Assignee: Magibrands, Inc., Woodinville, WA (US)

( * ) Notice: Subject to any disclaimer, the term of this patent is extended or adjusted under 35 U.S.C. 154(b) by 593 days.

(21) Appl. No.: 11/355,748

(22) Filed: Feb. 15, 2006

(65) Prior Publication Data
US 2006/0181154 A1      Aug. 17, 2006

Related U.S. Application Data

(60) Provisional application No. 60/653,583, filed on Feb. 15, 2005.

(51) Int. Cl.
*H03K 17/975* (2006.01)
(52) U.S. Cl. ........................................ 200/600
(58) Field of Classification Search ............ 200/600
See application file for complete search history.

(56) References Cited

U.S. PATENT DOCUMENTS

| 4,016,490 | A |   | 4/1977  | Weckenmann |         |
|-----------|---|---|---------|-------------|---------|
| 4,149,217 | A | * | 4/1979  | Tucker ............................. | 361/644 |
| 4,152,629 | A |   | 5/1979  | Raupp |         |
| 4,237,386 | A |   | 12/1980 | Instance |         |
| 4,293,745 | A |   | 10/1981 | Matsuda |         |
| 4,486,811 | A | * | 12/1984 | Kamiya et al. ................. | 200/600 |
| 4,668,876 | A |   | 5/1987  | Skarman |         |
| 4,672,229 | A |   | 6/1987  | Skarman |         |
| 4,723,080 | A |   | 2/1988  | Cline |         |
| 6,376,787 | B1 | * | 4/2002 | Martin et al. ................. | 200/181 |
| 6,756,703 | B2 | * | 6/2004 | Chang ........................... | 307/147 |

* cited by examiner

*Primary Examiner* — Renee Luebke
*Assistant Examiner* — Lheiren Mae Caroc
(74) *Attorney, Agent, or Firm* — Nathan O. Greene; Brinks Hofer Gilson & Lione

(57) ABSTRACT

An electric switch may include a sensing cube including circuitry for sensing a touch and activating the electric switch in response to said sensing. The circuitry may include a sensing circuit including a multi-dielectric configuration circuit configured with a plurality of impedance settings. A cover plate may be made of any of a plurality of materials and of a variable thickness. The circuitry is tuned (e.g., auto-calibrated) to one of the plurality of impedance settings based on a dielectric constant of the material and the thickness of the cover plate. The sensing circuit may be attached to a circuit board offset a distance from a capacitance target and an epoxy may encase the circuitry. The impedance settings may further be based on the distance and/or a dielectric constant of the epoxy.

32 Claims, 6 Drawing Sheets

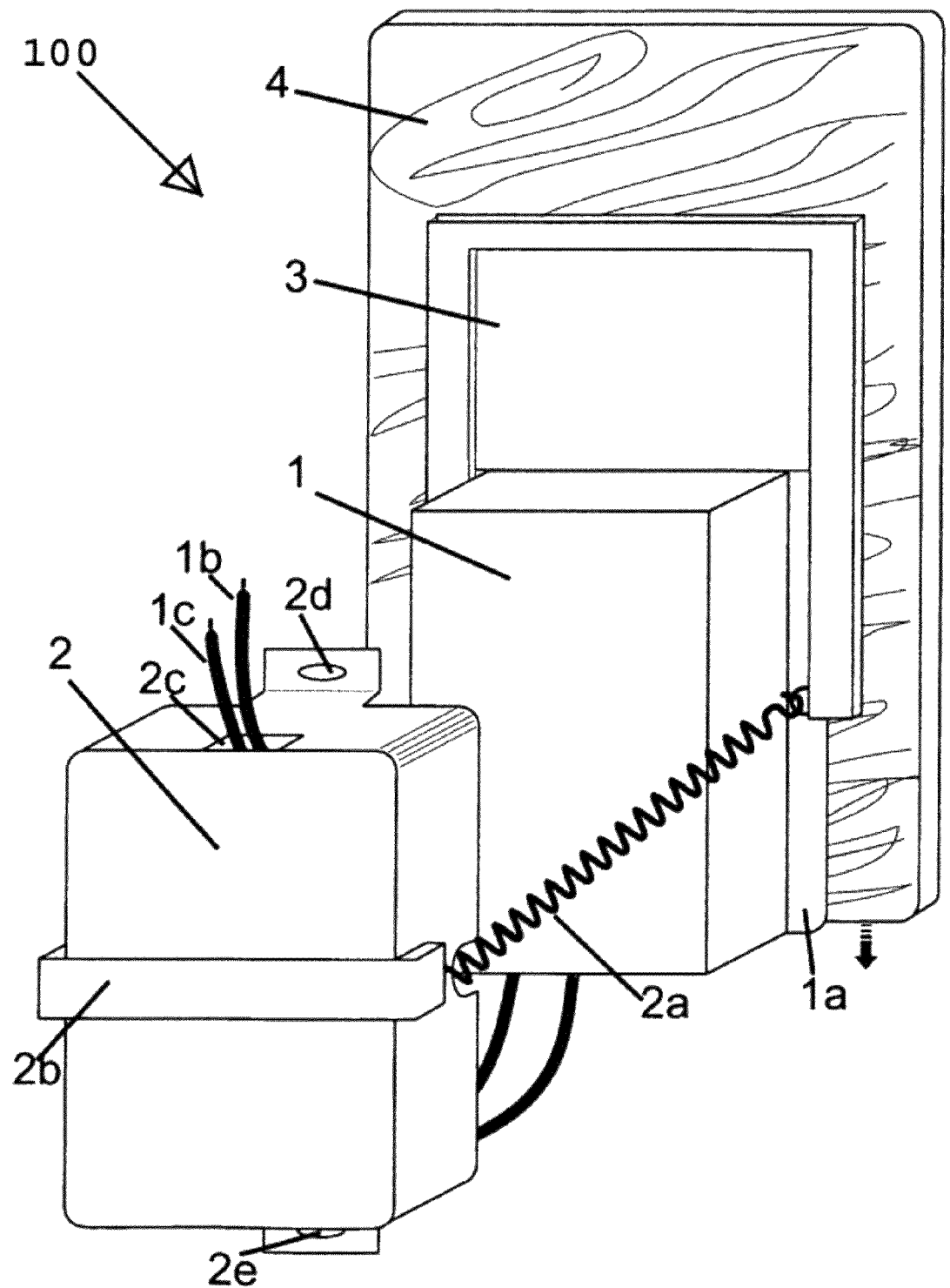

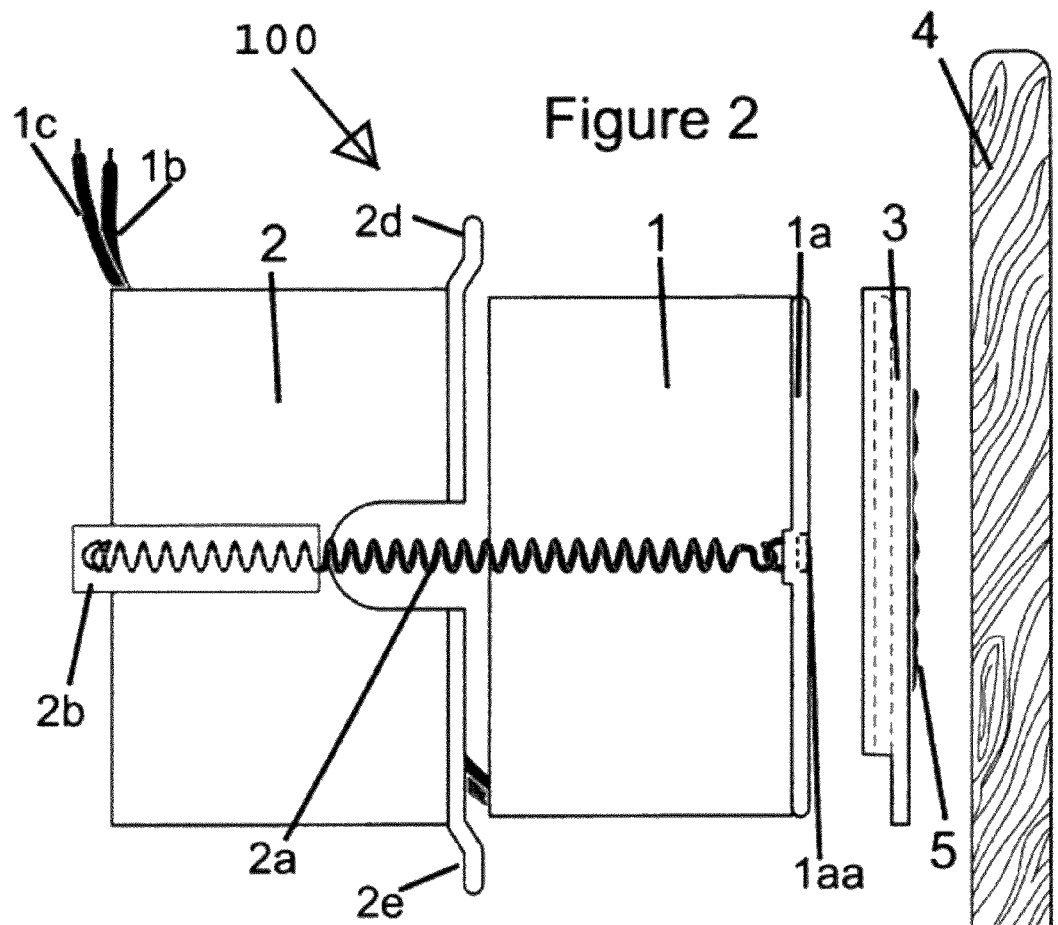
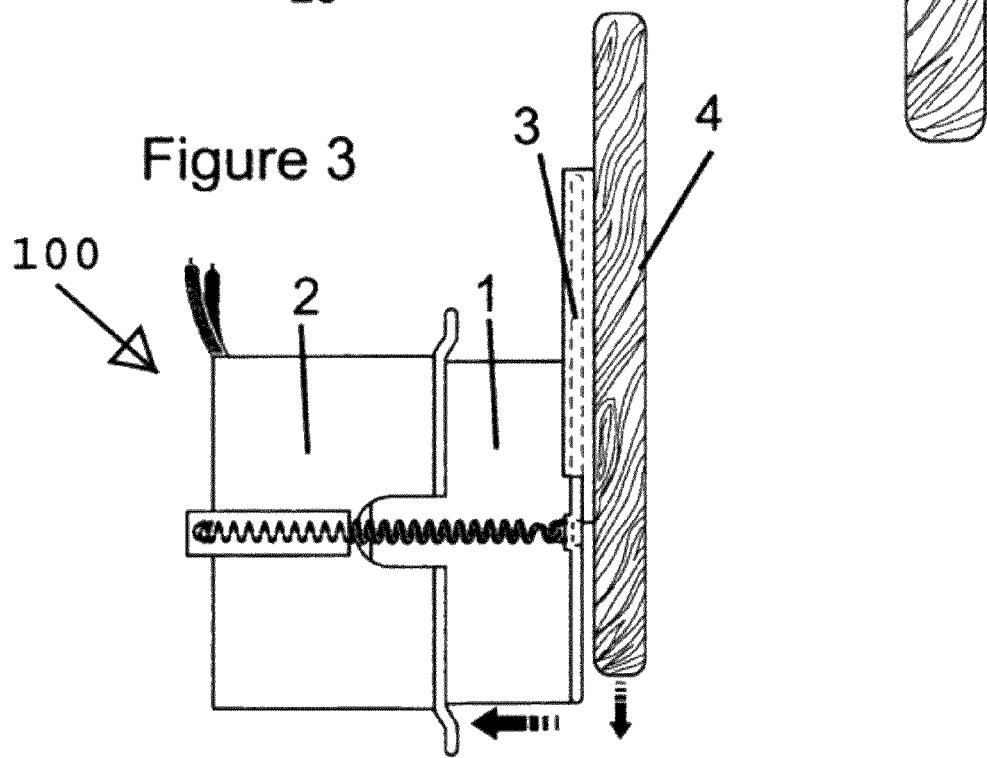

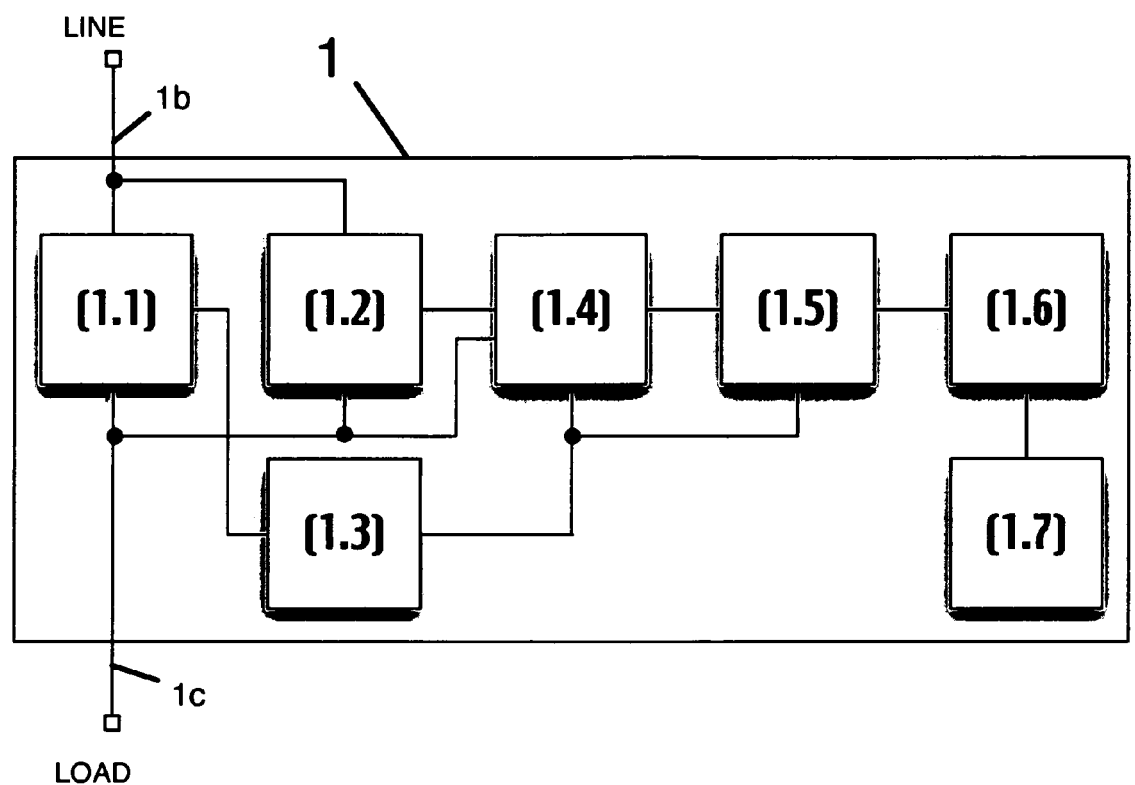
Figure 4: Electrical Block Diagram

Figure 5 Physical Layout of Circuit Boards
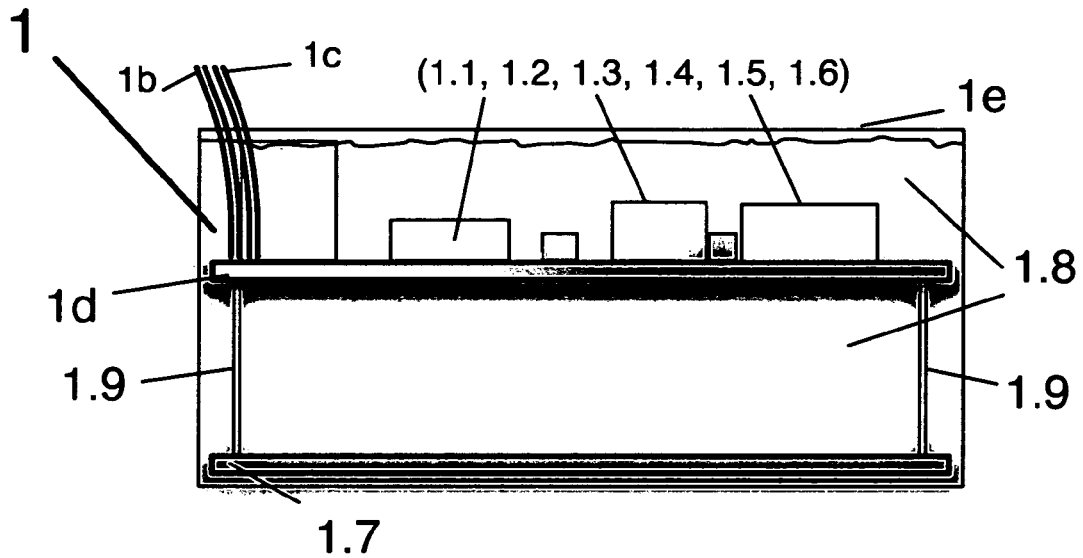
Figure 6 Capacitance Target & Ground Plane Circuit Board
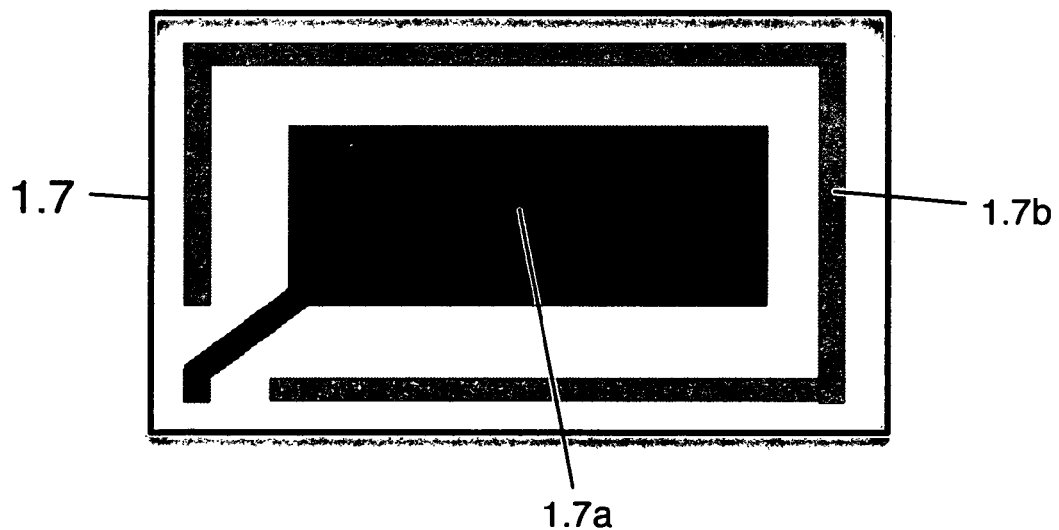

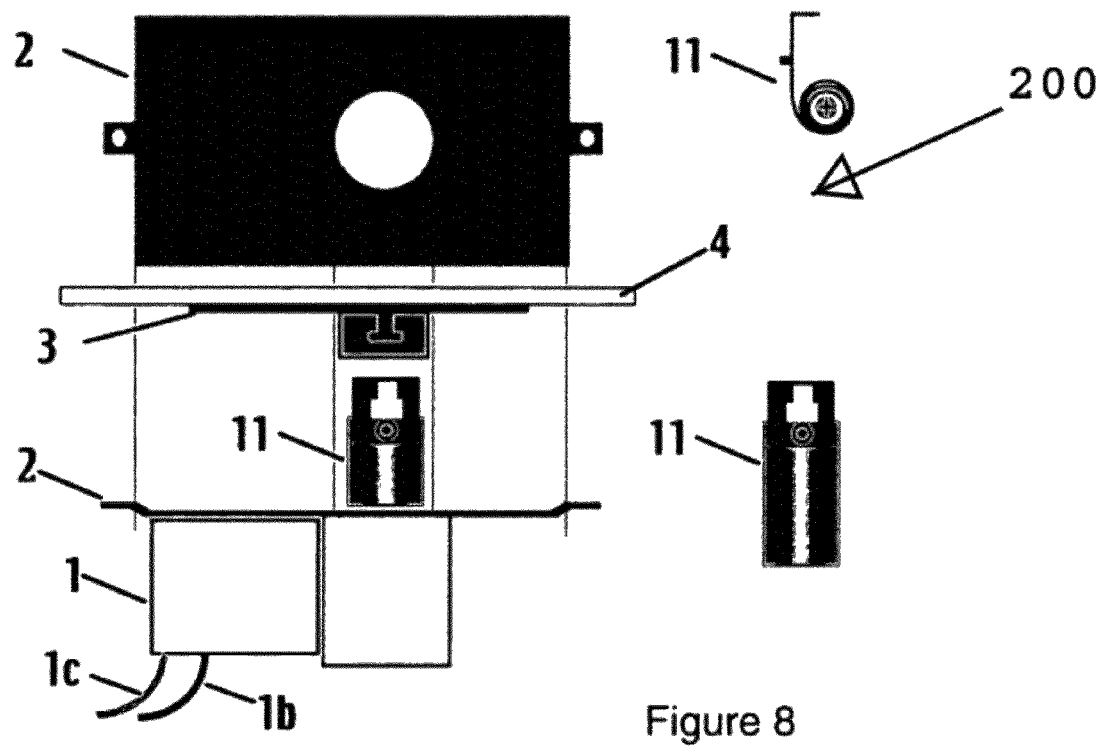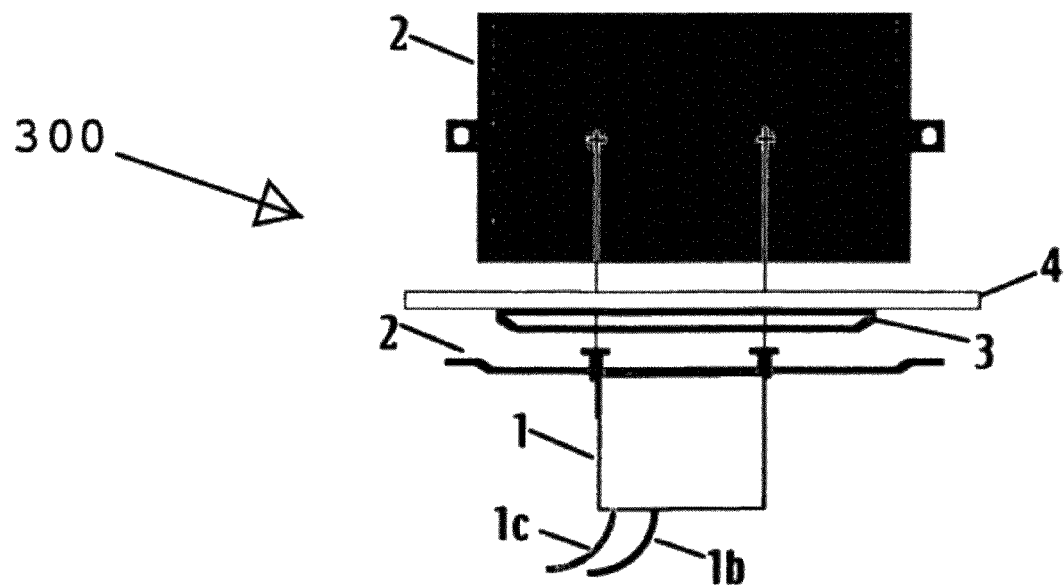

ELECTRIC-SWITCH ACTIVATED BY SENSING A TOUCH THROUGH A LARGE VARIETY OF COVER-PLATE MATERIALS

CROSS REFERENCE TO RELATED APPLICATIONS

This application claims the benefit of Provisional Patent Application Ser. No. 60/653,583, filed Feb. 15, 2005, which is herein incorporated by this reference in its entirety.

BACKGROUND

The present disclosure relates to wall-mounted electric switches and the mounting of electric switch cover plates. The electronic switch is used many times a day by anyone with electric lights and appliances. Edison was granted his patent on the Electric light bulb in 1880 and man has been trying to improve the way we turn on and off the bulb and other electronic appliances ever since.

The mechanical electric switch has improved over the years but it has been a slow evolution. Many of the undesirable aspects of the mechanical switch remain in most installations and are evident to most users, which include, for instance:

1. The ugly plastic lever that protrudes through expensive plates diminishing their esthetic value. The rocker switch was created to lessen the protrusion but requires even more plastic be visible and touched.

2. The mechanical switch is hard to clean, creating a health issue with its cheap plastic, small size, groves and live electric wires with no barricade to keep cleaning fluid from shorting the switch.

3. The mechanical electric switch requires an aesthetically-handicapped user interface which limits design options, can be noisy and almost eliminates the creation of homemade covers due to the need for precise slots for switch and mounting screw requirements.

4. The mechanical switch is difficult to install, needing to wrap thick wires around screws. A new method of installation for the connection system was created for electricians, but is also ineffective because it is difficult to disconnect.

Overcoming these limitations has been attempted through the years and is well documented as is explored below. The bulk of switches in use are mechanical switches that toggle or include the newer flatter rocker switch. Recent years have seen the advent of electrical switches that have improved on the mechanical switch, requiring only a touch to activate. These switches generally sense a touch on a painted metal target.

Leviton, a big electric switch manufacturer, has a line of switches that are activated by touch but look almost identical to the toggle mechanical switch it hopes to replace. See Leviton Catalog Number TTI06-1. In addition, the cover plate on this line of switches is not isolated from the circuit, actually exposing the user to 120 volts, though at very low current. Leviton uses a built-in plate with lead paint and provides no options for using other materials to match the look of a room, for a better feel or other purposes. The Leviton Touch Switch also recommends a third wire in the wall receptacle that is not always available especially in older installations.

All of these implementations define the look of the switch. The toggle, rocker and the painted metal cover plate must all be visible. Many people have tried to improve the look of mechanical switches, one switch at a time, using wallpaper or other material or by trying to disguise them because they are generally not aesthetically pleasing. Furthermore, the mechanical switches and the Leviton touch switch are vulnerable to corrosion with exposure of metal parts to moisture which will short if exposed to an appreciable amount of water.

Other previously-manufactured electrical switches that include touch sensing are limited in their circuitry such that the touch surface through which the switches are activated has to be a certain thickness and type of material to ensure proper calibration for sensing touch. These shortcomings have limited the creativity with which the switches are built and whether and to what extent the switches can be customized or updated aesthetically as designs of a room or space change.

SUMMARY

An electric switch may include a sensing cube including circuitry for sensing a touch and activating the electric switch in response to said sensing. The circuitry may include a sensing circuit including a multi-dielectric configuration circuit configured with a plurality of impedance settings. A cover plate—to which the sensing cube may be attached—may be made of any of a plurality of materials, including metal, and of a variable thickness. The circuitry is tuned (e.g., auto-calibrated) to one of the plurality of impedance settings based on a dielectric constant of the material and the thickness of the cover plate. The sensing circuit may be attached to a circuit board offset a distance from a capacitance target and an epoxy may encase the circuitry. The impedance settings may further be based on the distance and/or a dielectric constant of the epoxy. The circuit board may further include a triac controller where the sensing circuit activates the triac controller to toggle the electric switch on and off upon sensing a touch.

Connection standoffs may be positioned between the circuit board and the capacitance target to set the distance for an optimized gap that affects a capacitance value of the capacitance target, and thus a threshold level of capacitance before the switch is activated. A ground plane may surround the capacitance target to provide a floating ground, and thus aid in isolation of the circuitry within the sensing cube from a touch of an operator of the switch. The circuitry may be attached to: (1) a load wire and a line wire; or to (2) a load wire, a line wire and a common wire. The circuitry may also include a triac or a relay for connecting the line wire to the load wire.

The touch sensing cube may include a cube housing and a cover plate mounting system. The electric switch eliminates the need to flip a mechanical switch and allows for almost limitless options for the cover plate material and shape. The electric switch is activated by the capacitance sensing circuit that detects the electric field of the human body through a cover plate to which the sensing cube may be attached. The electric switch offers almost limitless flexibility in creating an aesthetically-pleasing look and feel because of the combination of the ability of the switch to sense a touch through a cover plate material of varying thickness and composition.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

FIG. 1 is a perspective view of a touch-sensing switch according to an embodiment of the present disclosure.

FIG. 2 is a side view of the touch-sensing switch of FIG. 1.

FIG. 3 is the side view of the touch-sensing switch of FIG. 2 for which a touch sensing cube slips inside of a cube housing for attachment to a wall or other surface.

FIG. 4 is an electrical block diagram of the circuitry of the touch-sensing switch according to FIGS. 1-4.

FIG. 5 is a side view of the inside of the sensing cube.

FIG. 6 is a capacitance target and surrounding ground plane for sensing touch and/or approximation of touch.

FIG. 7 is another embodiment of the touch-sensing switch, this one using a constant force spring.

FIG. 8 is an alternative embodiment of the touch-sensing switch, this one using a friction lever.

DETAILED DESCRIPTION

Figure 9:
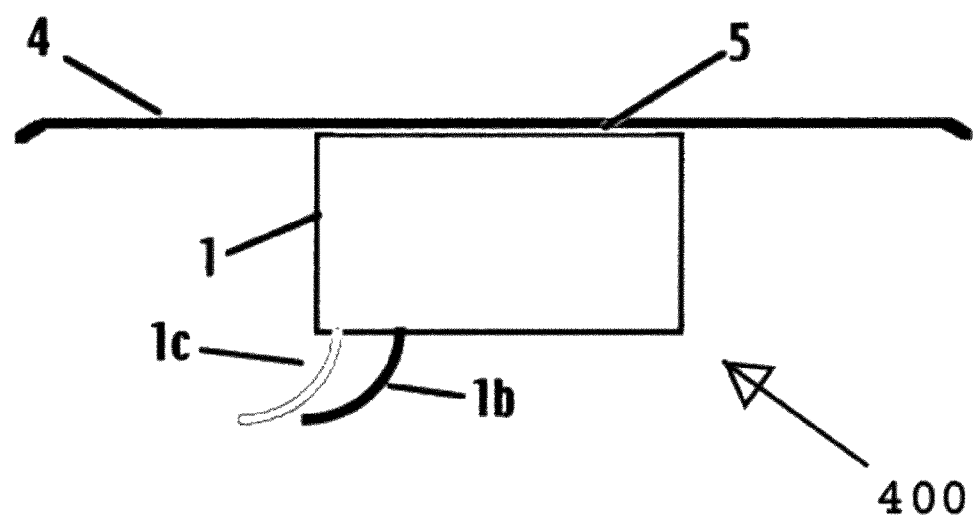
FIG. 9 is an alternative embodiment of the sensing cube connected to a standard cover plate blank, thus a simplified version of the mounting system in FIG. 1.

As an introduction, a touch-sensing switch according to the various embodiments of the present disclosure may include circuitry housed within a cube that seals the circuitry from moisture. The circuitry may include auto-calibrating logic that can adapt to different touch plates of varying thicknesses and types of materials through which the switch senses activation through touch. These materials can be anything from wood, stone, tile, plastic and metal as will be discussed in more detail.

More specifically, a touch-sensing switch 100 may include a sensing cube 1, a cube housing 2, a cover plate mounting bracket 3 and a cover plate 4 or standard blank 4. The mounting bracket 3 is optional in various embodiments as will be explained. In a first embodiment, the sensing cube 1 is held in the cube housing 2 by a cube housing spring 2a. The cube housing spring 2a extends around the back of the cube housing 2 and may be protected from the wires in the wall receptacle by a spring shield 2b, which is also part of the cube housing 2.

The cube housing spring 2a connects to a cube plate 1a on both sides of the sensing cube 1 at the length-wise mid-point of the cube plate 1a. The sensing cube 1 has two wires 1b and 1c that run across the back of the cube housing 2 and out the wire access hole 2c. The two wires are connected to the line 1b and load 1c wires with twist-on wire connectors inside a wall receptacle (not shown). The wires 1b and 1c are run across the back of the housing to lessen the strain on them as the sensing cube 1 is moved in and out of the cube housing 2.

The cube housing 2 may include two screw slots 2d and 2e at either end of the lengthwise dimension. The slots 2d and 2e may be used to screw the cube housing 2 into the wall receptacle and allow small adjustments to overcome any misalignment in the wall receptacle. The cube housing 2 can be made of various materials with the preferred materials being non-conductive.

With further reference to FIGS. 1-3, the cover plate mounting bracket 3 connects to the sensing cube 1 by sliding onto the cube plate 1a from the top and is held in place by friction and gravity. The cover plate 4 may be attached to the cover plate mounting bracket 3 with adhesive tape 5, thus avoiding use of screws or other connectors on the exterior of the cover plate 4. The cover plate mounting bracket 3 may be attached to the cover plate 4 before it is attached to the sensing cube 1.

The cover plate mounting bracket 3 holds the sensing cube 1 right behind the cover plate 4 for optimal sensitivity through the cover plate 4. The cube housing spring 2a pulls the cover plate 4 up against the wall surrounding the wall receptacle, making these physical interfaces amenable to automatically adjust for different wall receptacle depths within the wall.

The cover plate mounting bracket 3 also allows for quick installation of cover plates 4. By pulling the sensing cube 1 forward out of the cube housing 2 and rotating it slightly, the sensing cube 1 will remain outside of the wall receptacle and the cube housing 2. The cube plate 1a has an indent 1aa that allows a screwdriver or other common tool to be inserted to pull the sensing cube forward, out of the cube housing 2. The cube housing spring 2a holds the sensing cube 1 in place outside the cube housing 2.

The cover plate mounting bracket 3 with attached cover plate 4 can then be put in place. With the cover plate 3 attached to the sensing cube 1 using the cover plate mounting bracket 3, the cover plate 4 is pulled forward and rotated into alignment with the cube housing 2. Once in alignment, the housing spring 2a pulls the sensing cube 1 back into the cube housing 2 until the cover plate 4 is flush with the wall.

When a cover plate 4 is in place, the sensing cube 1 is pulled out of the cube housing 2 by pulling the cover plate 4 forward. The cover plate mounting bracket 3 includes tolerances that allow the cover plate 4 to be rotated a few degrees in both clockwise and counter-clockwise directions to adjust for misalignment of the wall receptacle. The cover plate mounting bracket 3 may be quickly attached to almost any object that is a desirable cover plate 4 with adhesive tape 5, thus spurring creativity and customization.

FIGS. 4-6 display an electrical block diagram of the circuitry of the touch-sensing switch 100. With reference to FIG. 4, the circuitry of the switch 100 may include a DC power source 1.1, a triac AC switch 1.2, a low voltage regulator 1.3, a triac controller 1.4, a touch sensing circuit 1.5, a multi-dielectric configuration circuit 1.6 and a capacitance target and ground plane circuit board 1.7. FIG. 5 shows the electronics located inside the sensing cube 1. The copper wires that are connected to line 1b and load 1c wires are connected to a circuit board 1d. The circuit board 1d may contain all the parts of the electrical circuit 1.1, 1.2, 1.3, 1.4, 1.5 and 1.6 except for the capacitance target and ground plane circuit board 1.7, which is shown in FIG. 6. The capacitance target and ground plane circuit board 1.7 includes a capacitance target 1.7a and a ground plane 1.7b.

The DC power supply 1.1 provides an unregulated DC power source by continuously chopping the triac AC switch 1.2 as controlled by the triac controller 1.4. This provides an input for the low voltage regulator circuit 1.3. The triac AC switch 1.2 receives the input signal on its triac gate from the triac controller 1.4 which is activated from the touch sensing circuit 1.5. The source and drain (not shown) of the triac AC switch 1.2 is chopped to maintain a DC voltage for the DC power supply 1.1 in the "Off" state and is at full conduction in the "On" state.

The low voltage-circuit 1.3 provides a regulated DC voltage to the triac controller 1.4 and the touch sensing circuit 1.5. The triac controller 1.4 is activated by a logic low on its sense pin which is supplied by the touch sensing circuit 1.5. The triac controller 1.4 may be a pulse generator that is synchronized to the AC line by monitoring the load and the line at the triac AC switch 1.2.

The touch sensing circuit 1.5 provides an activation pulse to the triac controller 1.4. It is triggered from the multi dielectric configuration circuit 1.6 and capacitance target and ground plane 1.7. It works by sensing a change of capacitance on the capacitance target 1.7a via the multi-dielectric configuration circuit 1.6 and converting it to a digital logic signal.

The multi-dielectric configuration circuit 1.6 provides multiple impedance configurations (or settings) to give an impressive (wide) range of multiple dielectrics via the capacitance target 1.7a. This translates to compatibility with a wide variety of touch plate materials for use by the consumer while maintaining maximum sensitivity.

The capacitance target 1.7a is on an integrated PC board platform consisting of a specially designed capacitance target 1.7a. The capacitance target 1.7a is copper artwork of a high dielectric constant. There is also an encircling ground plane 1.7b that enhances the stability of a two-wire configuration as shown in the Figures. The two-wire capability makes the product a direct replacement for existing two terminal mechanical switches.

Because the sensing cube 1 contains the capacitance-based touch sensing circuit 1.5, the triac AC switch 1.2 and other support circuits, including multi-dielectric configuration circuit 1.6, the sensing cube 1 is optimized to sense an electric field of a person through different cover plates 4. The optimization of the sensing cube 1 allows the cover plates 4 to be made of a variety of materials and thicknesses with different dielectric constants. The circuit optimization takes into account the interaction of the capacitive target 1.7a sensor with metal in the wall, any interference caused by the AC circuit and the varying dielectric constants of desirable cover plate materials including wood, stone, tile, plastic and metal. To accomplish this optimization, the settings of the multi-dielectric configuration circuit 1.6 were made variable by designing a very stable electronic circuit board 1d (especially for the two-wire implementation) including the multi-dielectric configuration circuit 1.6 within the touch sensing circuit 1.5. Furthermore, the sensing cube 1 is tuned to account for varying thickness and dielectric constants of different cover plates 4.

The sensing cube 1 may be further tuned depending on varying of the distance between the circuit board 1d and the dielectric capacitance target 1.7a, the target size and shape, the ground plane 1.7b surrounding the target 1.7a and selection of an epoxy 1.8 with an optimal dielectric constant to encase the electronics in the cube 1. The ground plane 1.7b surrounding the capacitance target 1.7a is important in the two-wire implementation because of the inherent instability of a floating ground.

The circuit board 1d and offset capacitance target and ground plane circuit board 1.7 are sealed into the cube using the epoxy 1.8 chosen for its low dielectric constant and thermal dissipation properties. The thermal dissipation is more important for higher load devices connected to the switch 100 due to the fact that losses in the triac AC switch 1.2 increase with the current flowing through it.

Instead of instantly going to full power, the triac AC switch 1.2 ramps to full power. This ramp increases the life of light bulbs because the filament has a chance to warm before being exposed to full power.

The entire electronic circuit including components 1.1 through 1.7 may be encapsulated with a special epoxy 1.8 that has properties of a low dielectric constant as well as sufficient thermal conductivity. This epoxy 1.8 becomes part of and is relevant to the function of the capacitance target 1.7a and the multi-dielectric configuration circuit 1.6.

The connection standoffs 1.9 provide a connection and spacing between the capacitance target 1.7a and the main circuit board 1d. The spacing provides an optimized gap which when filled by the encapsulating epoxy 1.8 is an optimized dielectric. This transforms the sensing cube 1 into a virtual capacitor. The plastic housing cube 1e houses the electronics circuits and circuit board 1d, the capacitance target 1.7a and ground plane 1.7b and the encapsulating epoxy 1.8.

The insulated copper wire 1b connects the sensing cube 1 to the utility line from the power grid while the copper wire 1c connects the sensing cube 1 to the utility load at a customer's premises. A commercial version of the touch-sensing switch 100 contains an air-gap switch as required for UL (Underwriter's Laboratories) approval. The touch-sensing switch 100 is not limited to working with electrical circuits only using the US standard 60 Hz 110 volts.

Once the touch-sensing switch 100 is installed in the wall receptacle, the switch is operated in a toggled fashion by simply touching or nearly touching the cover plate 4. More specifically, if the light or other device controlled by the switch was off, it is turned on when the cover plate 4 is touched. If the light or device was on, then it is turned off. When the cover plate 4 is touched, a change in the capacitance value of the capacitance target 1.7a is sensed by the capacitance sensing circuit 1.5 sending a pulse to the triac controller 1.4 which in turns sends a signal to the triac AC switch 1.2, causing it to switch from its current mode to the opposite mode.

With reference to FIGS. 7, 8 and 9, the sensing cube 1 lends itself to many possible embodiments. Three other embodiments are shown. The first alternative embodiment of a touch-sensing switch 200, in FIG. 7, uses a constant force spring 11 to pull the cover plate 4 using a variation of the mounting bracket 3. The second alternative embodiment of a touch-sensing switch 300, in FIG. 8, uses a friction lever to pull the cover plate 4 into place using two adjustable screws; and another variation on that theme is a single screw with a bigger screw head. The third alternative embodiment of a touch-sensing switch 400, in FIG. 9, is the sensing cube 1 connected directly to an off-the-shelf blank cover plate 4 using the adhesive tape 5.

To meet electrical needs such as florescent lights the sensing cube may require a common or ground wire connection. Still other cubes will have relays instead of a triac for high electrical load applications. The sensing cube may be modified to handle these other electrical requirements. Touch operation provides easier operation for physically-challenged people but also when hands are full, the switch can be activated by an elbow.

The ability to sense touch through almost any material and cover plate mounting system provides the following advantages, among others. Aesthetically-pleasing cover plates 4 with no holes for mechanical or touch-sensing switches may be used as screws are not required. Cover plates are easier to clean and provide health benefits. Cover plates may be of different materials and thicknesses and touch sensing adapts to variance in thicknesses and dielectric constants of the different materials. The touch-sensing switch may be conveniently mounted by attaching the mounting bracket to the rear of the cover plate, sliding it onto the sensing cube and letting the spring pull it up to the wall.

Cover plates 4 may also be 3-dimensional as well as any 2D shape. For instance, a cover plate may be made from half a baseball or a cartoon character with the cover plate's shape matching that of the character's face. Cover plates that compliment any interior design, using granite, wood, ceramic tile, marble or leather and the like. These aspects mean that a consumer can customize the cover plate 4 for seasonal purposes. The mounting bracket 3 easily bonds to any surface with double-sided adhesive tape to allow a selection of materials and objects. The design has a cool factor with ease of creating homemade cover plates 4 that may be quickly replaced.

Integration of the triac AC switch 1.2 ramps power on and off, thus saving light bulb life but not hitting the filament with full power while the filament is cold. Eliminating the mechanical switch eliminates the mechanical noises of the switch flipping. The switch 100 may be adapted as a direct replacement for all existing electric switches, and there is no need to add a ground wire to the electric wall receptacle. The encased epoxied sensing cube 1 isolates the electronics, providing safety in which a screw driver cannot short out the electronics or cause electric shock, and protects against corrosion. The switch's electrical design replaces switches for lights, ceiling fans, garbage disposals, extraction fans or the like in your home, garage, office or boat.

Although the description above contains many specifics, these should not be construed as limiting the scope of the touch-sensing switch but as merely providing illustrations of some of the presently-preferred embodiments of the present disclosure. For example, the sensing mechanism need not be encased in epoxy and more than one sensing cube can be used in a dual or multi-switch wall receptacle. Alternatively, a sensing cube can be omitted. Thus the scope of the disclosure should be determined by the appended claims and their legal equivalents, rather than by the specifics given.

I claim:

1. An electric switch, comprising:
a sensing cube including circuitry for sensing a touch and activating the electric switch in response to said sensing, said circuitry including a multi-dielectric configuration circuit configured with a plurality of impedance settings; and
a cover plate made of any of a plurality of materials and of a variable thickness, wherein the sensing cube is attachable to the cover plate and said circuitry is tuned to one of the plurality of impedance settings based on a dielectric constant of the material and the thickness of the cover plate.

2. The electric switch of claim 1 further comprising:
a capacitance target located near at least one side of the sensing cube and in communication with the multi-dielectric configuration circuit, wherein said activation of the electric switch is caused when the multi-dielectric configuration circuit senses a change in a capacitance value of the capacitance target.

3. The electric switch of claim 2 wherein the capacitance target is located inside the sensing cube and wherein said change in capacitance is caused by proximity of an electric field within a human to the capacitance target.

4. The electric switch of claim 2 wherein said circuitry comprises a main circuit board to which said multi-dielectric configuration circuit is attached.

5. The electric switch of claim 4 further comprising connection standoffs positioned between the main circuit board and the capacitance target to provide an optimized gap that affects the capacitance value.

6. The electric switch of claim 5 wherein said capacitance target is surrounded by a ground plane.

7. The electric switch of claim 1 wherein the circuitry is encased in an epoxy, the impedance settings further based on a dielectric constant of said epoxy.

8. The electric switch of claim 7 wherein said epoxy becomes part of the circuitry and dissipates heat.

9. The electric switch of claim 7 wherein the multi-dielectric configuration circuit senses a change in capacitance through any of a plurality of cover plates of different dielectric constants, including standard off-the-shelf electric switch blanks.

10. The electric switch of claim 1 wherein said circuitry is attached to one of: (i) a load and a line wire and (ii) a load, a line and a common wire.

11. The electric switch of claim 10 wherein said circuitry comprises a triac or a relay for connecting the line wire to the load wire.

12. The electric switch of claim 1 wherein said circuitry is electrically isolated from an operator that provides the touch and the sensing cube seals out corrosive elements and water.

13. The electric switch of claim 1 wherein the sensing cube is attached to the cover plate with adhesive.

14. The electric switch of claim 1 wherein the material of the cover plate comprises metal.

15. An electric switch comprising:
a capacitance target for sensing a touch or proximity of a touch;
a sensing cube encasing a circuit board with a sensing circuit attached thereto, the circuit board offset a distance from the capacitance target, said sensing circuit configured with a plurality of impedance settings; and
a cover plate made of any of a plurality of materials and of a variable thickness, wherein the sensing cube is attachable to the cover plate and said sensing circuit is tuned to one of the plurality of impedance settings based on the distance, a dielectric constant of the materials and the thickness of the cover plate;
wherein said sensing circuit is configured to activate the electric switch upon sensing the touch or proximity of the touch through the cover plate.

16. The electric switch of claim 15 wherein the circuit board further includes a triac controller, the sensing circuit to activate the triac controller to toggle the electric switch upon sensing the touch.

17. The electric switch of claim 15 wherein the sensing cube is attached to the cover plate with an adhesive tape.

18. The electric switch of claim 15 wherein the material of the cover plate comprises metal.

19. The electric switch of claim 15 wherein the capacitance target is located near at least one side of the sensing cube and in communication with the circuit board, wherein activation of the electric switch is caused when the sensing circuit senses a change in a capacitance value of the capacitance target based on proximity of a human digit.

20. The electric switch of claim 19 wherein the capacitance target is located inside the sensing cube.

21. The electric switch of claim 15 wherein the circuit board and the inside of the sensing cube is encased in an epoxy, the impedance settings further based on a dielectric constant of said epoxy.

22. The electric switch of claim 21 wherein the sensing cube and the epoxy electrically isolate the circuit board from an operator that provides the touch and the sensing cube seals out corrosive elements and water.

23. The electric switch of claim 15 further comprising connection standoffs positioned between the circuit board and the capacitance targets, the connection standoffs to set the distance and thus to provide an optimized gap that affects a capacitance value of the capacitance target.

24. The electric switch of claim 15 wherein said capacitance target is surrounded by a ground plane.

25. The electric switch of claim 15 wherein the sensing cube is optimized to account for cover plates of different materials and thicknesses, the optimization obtained at least in part by configuring a multi-dielectric configuration circuit of the sensing circuit to be tunable to the plurality of impedance settings.

26. An electric switch comprising:
a capacitance target for sensing a touch or proximity of a touch;

a circuit board having a sensing circuit attached thereto, the circuit board offset a distance from the capacitance target, said sensing circuit configured with a plurality of impedance settings; and a cover plate made of any of a plurality of materials and of variable thicknesses and located adjacent the capacitance target;

wherein said sensing circuit is tuned to one of the plurality of impedance settings based on the distance, a dielectric constant of the materials and the thickness of the cover plate; and wherein said sensing circuit is configured to activate the electric switch upon sensing the touch or the proximity of a touch through the cover plate.

27. The electric switch of claim 26 further comprising:

a sensing cube to contain the circuit board and the capacitance target, the sensing cube encased in an epoxy and attached to the cover plate, wherein the impedance settings are further based on a dielectric constant of said epoxy.

28. The electric switch of claim 27 wherein the capacitance target is located near a side of the sensing cube and in communication with the circuit board, wherein activation of the electric switch is caused when the sensing circuit senses a change in a capacitance value of the capacitance target based on proximity of a human digit.

29. The electric switch of claim 27 wherein the sensing cube is optimized to account for cover plates of different materials and thicknesses, the optimization obtained at least in part by configuring a multi-dielectric configuration circuit of the sensing circuit to be tunable to the plurality of impedance settings.

30. The electric switch of claim 26 further comprising connection standoffs positioned between the circuit board and the capacitance targets, the connection standoffs to set the distance and thus to provide an optimized gap that affects a capacitance value of the capacitance target.

31. The electric switch of claim 26 wherein said capacitance target is surrounded by a ground plane.

32. The electric switch of claim 26 wherein the material of the cover plate comprises metal.

* * * * *